United States Patent
Fujii et al.

(10) Patent No.: US 6,809,614 B2
(45) Date of Patent: Oct. 26, 2004

(54) SURFACE ACOUSTIC WAVE DEVICE HAVING BALANCED AND UNBALANCED TERMINALS AND A DELAY LINE

(75) Inventors: Yasuhisa Fujii, Kanazawa (JP); Minefumi Ouchi, Ishikawa-ken (JP); Masaru Yata, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 36 days.

(21) Appl. No.: 10/327,052

(22) Filed: Dec. 24, 2002

(65) Prior Publication Data
US 2003/0117239 A1 Jun. 26, 2003

(30) Foreign Application Priority Data
Dec. 25, 2001 (JP) .................... 2001-391515
Nov. 11, 2002 (JP) .................... 2002-326776

(51) Int. Cl.⁷ .................... H03H 9/64
(52) U.S. Cl. .................... 333/193; 333/195; 310/313 B
(58) Field of Search .................... 333/193–196, 333/133, 141, 142; 310/313 B, 313 D (56) References Cited

U.S. PATENT DOCUMENTS 5,757,248 A * 5/1998 Bardal .................... 333/33
5,994,980 A * 11/1999 Tada .................... 333/193

FOREIGN PATENT DOCUMENTS

JP 2002-271168 * 9/2002

* cited by examiner

Primary Examiner—Barbara Summons
(74) Attorney, Agent, or Firm—Keating&Bennett, LLP (57) ABSTRACT

A surface acoustic wave device includes a first surface acoustic wave filter including at least two interdigital transducer IDTs arranged along a surface acoustic wave propagation direction on a piezoelectric substrate, and a second surface acoustic wave filter including at least two interdigital transducer IDTs arranged along the surface acoustic wave propagation direction on a piezoelectric substrate. The input terminals of the first and second surface acoustic wave filters are electrically connected to each other and to an unbalanced signal terminal via a common connection point. The output terminals of the surface acoustic wave filters are connected to balanced signal terminals, respectively. A delay line is introduced between the common connection point and the first surface acoustic wave filter on the piezoelectric substrate.

17 Claims, 6 Drawing Sheets

SURFACE ACOUSTIC WAVE DEVICE HAVING BALANCED AND UNBALANCED TERMINALS AND A DELAY LINE

BACKGROUND OF THE INVENTION

1. Field of the Invention

The present invention relates to a surface acoustic wave device for use, for example, as a band-pass filter, and more particularly, to a surface acoustic wave device of which at least one of the input terminal and the output terminal is an unbalanced signal terminal.

2. Description of the Related Art

In recent years, the demand for surface acoustic wave devices for use in the RF stages of portable telephones and having a balanced-to-unbalanced function, a so-called balun function, have increased, and the use of such devices in the RF stages of GSM system portable telephones has started.

Regarding the balanced-to-unbalanced function, the difference between the amplitudes at a pair of terminals provided on the balance side (hereinafter, referred to as an amplitude balance characteristic) is required to be zero, and the difference between the phases (hereinafter, referred to as a phase balance characteristic) is required to be about 180°.

Figure 6:
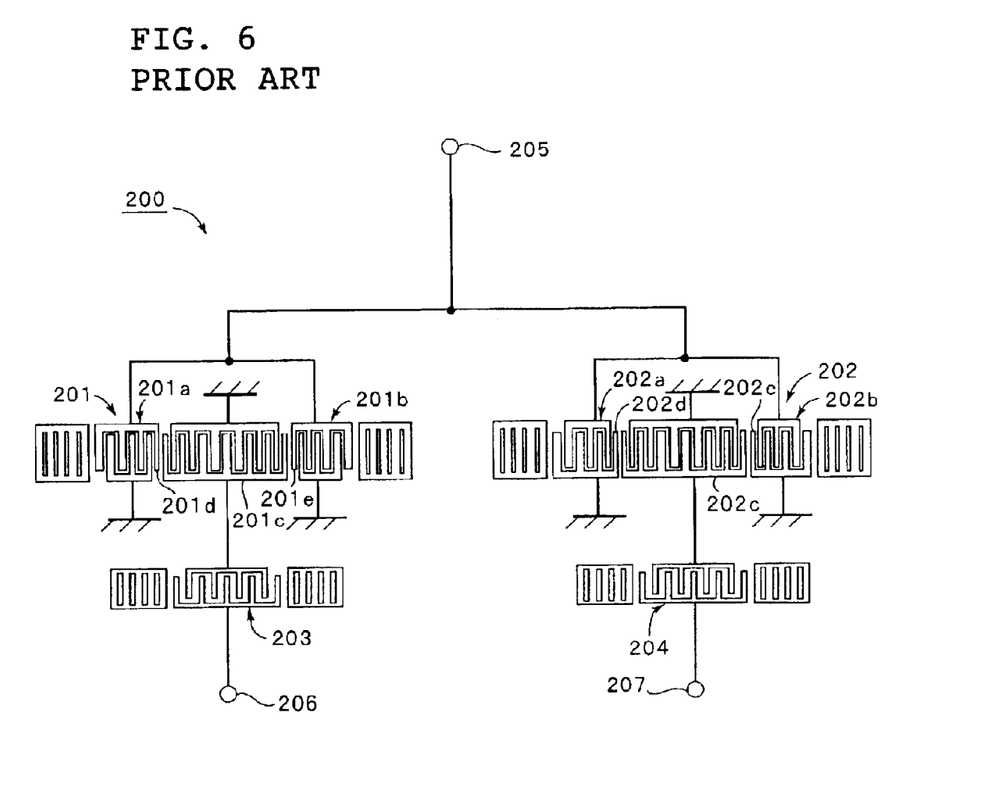
FIG. 6 is a schematic plan view of an example of the related art surface acoustic wave device.

FIG. 6 is a schematic view of an example of a related art surface acoustic wave device having a balanced-to-unbalanced function.

In a surface acoustic wave device 200 shown in FIG. 6, longitudinally-coupled resonator type SAW filters 201 and 202, and 1 port type SAW resonators 203 and 204 are composed of Al electrodes on a piezoelectric substrate. The input sides of the SAW filters 201 and 202 are connected in parallel to each other and also are connected to an unbalanced signal terminal 205. The output sides of the SAW filters 201 and 202 are connected in series with the SAW resonators 203 and 204, respectively. The SAW resonators 203 and 204 are connected to balanced signal terminals 206 and 207, respectively.

In the SAW filter 201 shown in FIG. 6, IDTs 201a and 201b which are positioned on the unbalanced sides and are adjacent to reflectors have inverted-shapes with respect to IDTs 202a and 202b which are adjacent to the reflectors in the SAW filter 202. As a result, a signal output from the balanced signal terminal 206 and the signal output from the balanced signal terminal 207 have a phase difference of 180°.

According to the configuration shown in FIG. 6, of a plurality of the electrodes of the IDT 201a and the IDT 201b contained in the SAW filter 201, the electrode fingers 201d and 201e which are adjacent to the center IDT 201c are connected to the unbalanced signal terminal 205, respectively. On the other hand, of a plurality of the electrodes of the IDT 202a and the IDT 202b of the SAW filter 202, the electrode fingers 202d and 202e which are adjacent to the center IDT 202c are connected to the ground potential, respectively. Accordingly, the phase characteristic of the SAW filter 202 is not exactly equal to the inverted characteristic obtained when the phase of the SAW filter 201 is inverted by 180°. Thus, the phase balance characteristic of the surface acoustic wave 200 device can not be equal to 180° which is an ideal value.

Moreover, in some of the related art surface acoustic wave devices having a balanced-to-unbalanced conversion function, the layout thereof such as a wiring structure ranging from an unbalanced signal terminal to a pair of balanced signal terminals is not symmetrical with respect to the unbalanced signal terminal. In this case, the parasitic capacitances of the lines extending to a pair of the balanced signal terminals become different. This readily causes deterioration of the phase balance characteristic.

SUMMARY OF THE INVENTION

In order to overcome the problems described above, preferred embodiments of the present invention provide a surface acoustic wave device having a balanced-to-unbalanced function and a superior phase balance characteristic.

According to a first preferred embodiment of the present invention, a surface acoustic wave device includes a piezoelectric substrate, at least one interdigital transducer IDT arranged on the piezoelectric substrate, an input terminal and an output terminal, one of the input terminal and the output terminal including an unbalanced signal terminal, the other of the input terminal and the output terminal including first and second balanced signal terminals, and a delay line provided on the unbalanced signal terminal side in the path between the unbalanced signal terminal and the first balanced signal terminal. Accordingly, the phase of a signal in the line in which the delay line is introduced is delayed, due to the introduction of the delay line. Thus, the phase balance characteristic is greatly improved. As a result, the surface acoustic wave device having a balanced-to-unbalanced function with a superior phase balance characteristic is provided.

Preferably, the delay line is disposed on the piezoelectric substrate. In this case, the surface acoustic wave device can be easily designed compared to the case where the delay line is disposed on the package. Moreover, the delay line can be formed easily with high precision on the piezoelectric substrate using a photolithography technique, for example. Moreover, the design of the delay line can be easily changed.

According to a second preferred embodiment of the present invention, a surface acoustic wave device includes a first surface acoustic wave filter element including a first piezoelectric substrate, and at least two interdigital transducers (IDTs) arranged along the surface acoustic wave propagation direction on the first piezoelectric substrate, a second surface acoustic wave filter element including a second piezoelectric substrate, and at least two interdigital transducers (IDTs) arranged along the surface acoustic wave propagation direction on the second piezoelectric substrate, the second surface acoustic wave filter element having a transmission phase characteristic that is different by about 180° from that of the first surface acoustic wave filter element, the first and second surface acoustic wave filter elements each having an input terminal and an output terminal, certain ones of the input terminals and the output terminals of the first and second surface acoustic wave filter elements being commonly connected to each other at a common connection point, an unbalanced signal terminal being connected to the common connection point, the other terminals of the input terminals and the output terminals of the first and second surface acoustic wave filter elements defining first and second balanced signal terminals, respectively, and a delay line provided between the common connection point and the first surface acoustic wave filter element. Thus, the phase of a signal on the first surface acoustic wave filter element side is delayed compared to the phase of the signal on the other surface acoustic wave filter element side, and hence, the phase balance characteristic is greatly improved.

Also, preferably, the delay line is disposed on the piezoelectric substrate. In this case, the surface acoustic wave device can be easily designed compared to the case where the delay line is disposed on the package. Also, the cost can be greatly reduced. Moreover, the delay line can be formed easily with high precision on the piezoelectric substrate using a photolithography technique, for example. Further, the design of the delay line can be easily changed.

Preferably, the length of the signal line between the common connection point and the IDTs of the first surface acoustic wave filter element electrically connected to the common connection point is different from the length of the signal line between the common connection point and the IDTs of the second surface acoustic wave filter element electrically connected to the common connection point. This line length difference defines the delay line.

Also, preferably, the device is configured so that the phases of input-output signals in the line between the unbalanced signal terminal and the first balanced signal terminal and, those of the input-output signals in the line between the unbalanced signal terminal and the second balanced signal terminal are different by about 0.5° to about 4° from each other, due to the delay line.

Preferably, the surface acoustic wave device includes a second delay line which is connected to the first balanced signal terminal and is disposed on the piezoelectric substrate. In this case, both the delay lines can be dispersed for arrangement, and thereby, the phase balance characteristic can be more effectively improved. Moreover, the length of each delay line can be reduced, and the delay lines can be easily arranged.

Further, preferably, the device is configured so that the phases of input-output signals in the line between the unbalanced signal terminal and the first balanced signal terminal and, those of the input-output signals in the line between the unbalanced signal terminal and the second balanced signal terminal are different by about 0.5° to about 4° from each other, due to the above-described delay line and the second delay line. Thus, the phase balance characteristic of the surface acoustic wave device can be effectively improved, and moreover, the size can be further reduced, while deterioration of other characteristics can be prevented.

The above-described advantages can be obtained in the configuration of the device in which the delay line and the second delay line are arranged in such a manner that the phases of an electrical signal are different from each other by a degree of about 0.5° to about 4°.

According to a third preferred embodiment of the present invention, a surface acoustic wave device includes a first surface acoustic wave filter element including a first piezoelectric substrate, and at least two interdigital transducers (IDTs) arranged along the surface acoustic wave propagation direction on the first piezoelectric substrate, a second surface acoustic wave filter element including a second piezoelectric substrate, and at least two interdigital transducers (IDTs) arranged along the surface acoustic wave propagation direction on the second piezoelectric substrate, the second surface acoustic wave filter element having a transmission phase characteristic that is different by about 180° from that of the first surface acoustic wave filter element, the first and second surface acoustic wave filter elements each having an input terminal and an output terminal, selected ones of the input terminals and the output terminals of the first and second surface acoustic wave filter elements being commonly connected to each other at a common connection point, an unbalanced signal terminal being connected to the common connection point, and the other terminals of the input terminals and the output terminals of the first and second surface acoustic wave filter elements defining first and second balanced signal terminals, respectively, wherein a first length of the signal line between the common connection point and the interdigital transducers of the first surface acoustic wave filter element electrically connected to the common connection point is different from a second length of the signal line between the common connection point and the interdigital transducers of the second surface acoustic wave filter element electrically connected to the common connection point. Accordingly, the phase of one of the first and second surface acoustic wave filter elements is delayed compared to that of the other of the first and second surface acoustic wave filter elements, and thereby, the phase balance characteristic is greatly improved.

Preferably, the first length of the signal line between the common connection point and the interdigital transducers of the first surface acoustic wave filter element electrically connected to the common connection point and the second length of the signal line between the common connection point and the interdigital transducers of the second surface acoustic wave filter element electrically connected to the common connection point are different from each other such that the phases of input-output signals are different from each other by a degree of about 0.5° to about 4° in the line between the unbalanced signal terminal and the first balanced signal terminal and in the line between the unbalanced signal terminal and the second balanced signal terminal. In this case, the phase balance characteristic is more effectively improved, the size can be further reduced, and deterioration of other characteristics can be reliably prevented.

Preferably, on the piezoelectric substrate, the length of the signal line between the unbalanced signal terminal and the first balanced signal terminal and the length of the signal line between the unbalanced signal terminal and the second balanced signal terminal are different from each other, and the difference L (mm) between the line lengths preferably satisfies the formula $417/fc < L < 3330/fc$ in which fc represents the center frequency (MHz). Also, in this case, the phase balance characteristic of the surface acoustic wave device can be more effectively improved.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the present invention will be more apparent from the following description of preferred embodiments thereof made with reference to the accompanying drawings.

Figure 1:
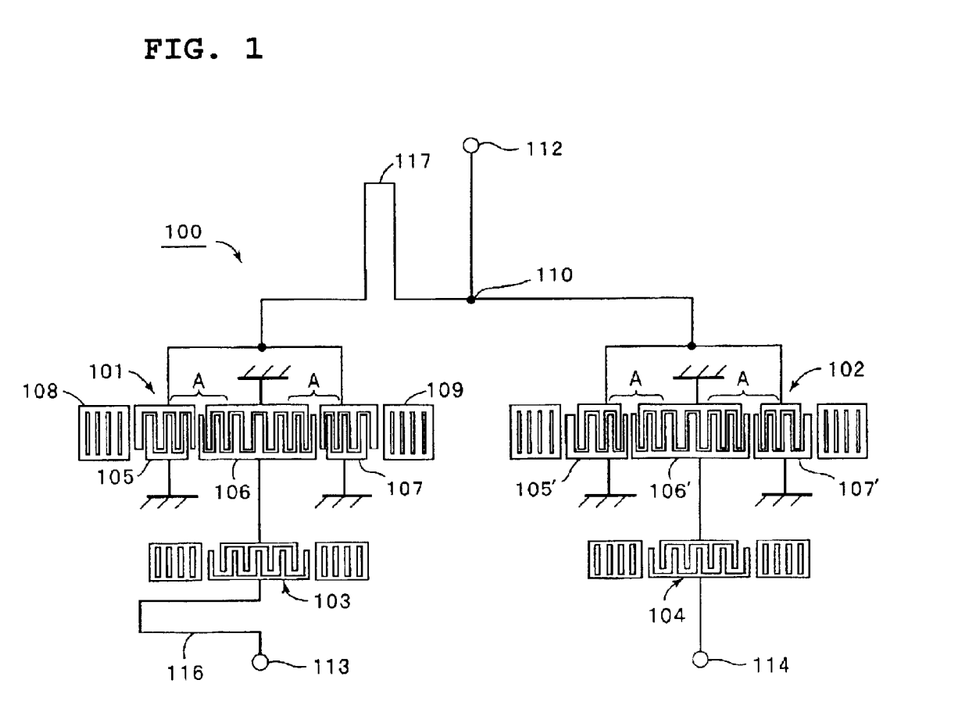
FIG. 1 is a schematic plan view of a surface acoustic wave device according to a preferred embodiment of the present invention.

FIG. 1 is a schematic plan view of a surface acoustic wave device according to a first preferred embodiment of the present invention.

According to the first preferred embodiment, the electrode structure shown in FIG. 1 is formed on a piezoelectric substrate preferably using Al electrodes. A 40±5° Y cut X propagation LiTaO$_3$ substrate is preferably used as the piezoelectric substrate. The piezoelectric material for the piezoelectric substrate is not restricted to the above-described material and other materials may be used. LiTaO$_3$ substrates having other cut angles, piezoelectric single crystal substrates of 64° to 72° Y cut X propagation LiNbO$_3$ and 41° Y cut X propagation LiNbO$_3$, and piezoelectric ceramic substrates may be used, for example.

First and second longitudinally coupled type resonator type SAW filters 101 and 102 and 1 port type SAW resonator 103 and 104 are disposed on the piezoelectric substrate.

In the SAW filter 101, IDTs 105 to 107 are arranged in the surface acoustic wave propagation direction. Reflectors 108 and 109 are arranged on the opposite sides in the surface acoustic wave propagation direction of the region of the piezoelectric substrate where the IDTs 105 to 107 are located, respectively.

The pitches of at least two electrode fingers of the IDTs 105 and 106 facing the interval between the IDTs 105 and 106 and at least two electrode fingers of IDTs 106 and 107 facing the interval between the IDTs 106 and 107 are preferably smaller than the pitches of the other electrode fingers, respectively. For example, the pitch of at least two electrode fingers arranged in each of the areas A shown in FIG. 1 is preferably smaller than that of the other electrode fingers of the IDTs 105 to 107.

The SAW filter 102 is preferably configured in a manner that is similar to that for the SAW filter 101. However, the direction (the upper-lower side direction of FIG. 1) of the IDTs 105' and 107' of the SAW filter 102 is reverse relative to that of the IDTs 105 and 107 of the SAW filter 101. In particular, the IDTs 105' and 107' are arranged reversely relative to the IDTs 105 and 107 so that an output signal from the SAW filter 101 has a phase that is opposite to that of the output signal from the SAW filter 102.

The SAW resonators 103 and 104 are connected in series with the output terminals of the SAW filters 101 and 102, respectively.

In the surface acoustic wave device 100, the SAW filters 101 and 102 are connected to each other at a common connection point 110. The common connection point 110 is connected to an unbalanced signal terminal 112 which functions as an input signal terminal.

On the other hand, first and second balanced signal terminals 113 and 114 which define output terminals are connected to the output sides of the SAW resonators 103 and 104, respectively.

Furthermore, a delay line 117 is incorporated between the input side of the SAW filter 101 and the common connection point 110. The delay line 117 is introduced on the unbalanced signal terminal side according to this preferred embodiment of the present invention. Moreover, a second delay line 116 is included between the SAW resonator 103 and the balanced signal terminal 113.

The delay lines 116 and 117 are preferably formed by bending the signal lines made of Al electrodes, that is, increasing the transmission lines, respectively.

Specific designs for the surface acoustic wave device of this particular preferred embodiment will be described below. It is to be noted that in the following description, the term "interval" means the distance between the centers of two electrode fingers.

- the finger overlap of electrode fingers in SAW filters 101 and 102: about 75 μm
- the number of IDT electrode fingers in SAW filters 101 and 102:
    - 22 electrode fingers in IDT 105 (of the 22 electrode fingers, 3 electrode fingers exist in the above-described narrow pitch region),
    - 33 electrode fingers in IDT 106 (of the 33 electrode fingers, the 3 electrode fingers exist in each of the narrow pitch regions arranged on the both side ends in the surface acoustic wave propagation direction of IDT 106, and
    - 22 electrode fingers in IDT 107 (of the 22 electrode fingers, the 3 electrode fingers exist in the above-described narrow pitch region)

The numbers of electrode fingers in the IDTs 105', 106', and 107' are preferably equal to those of the IDTs 105, 106, and 107, respectively.

Figure 2:
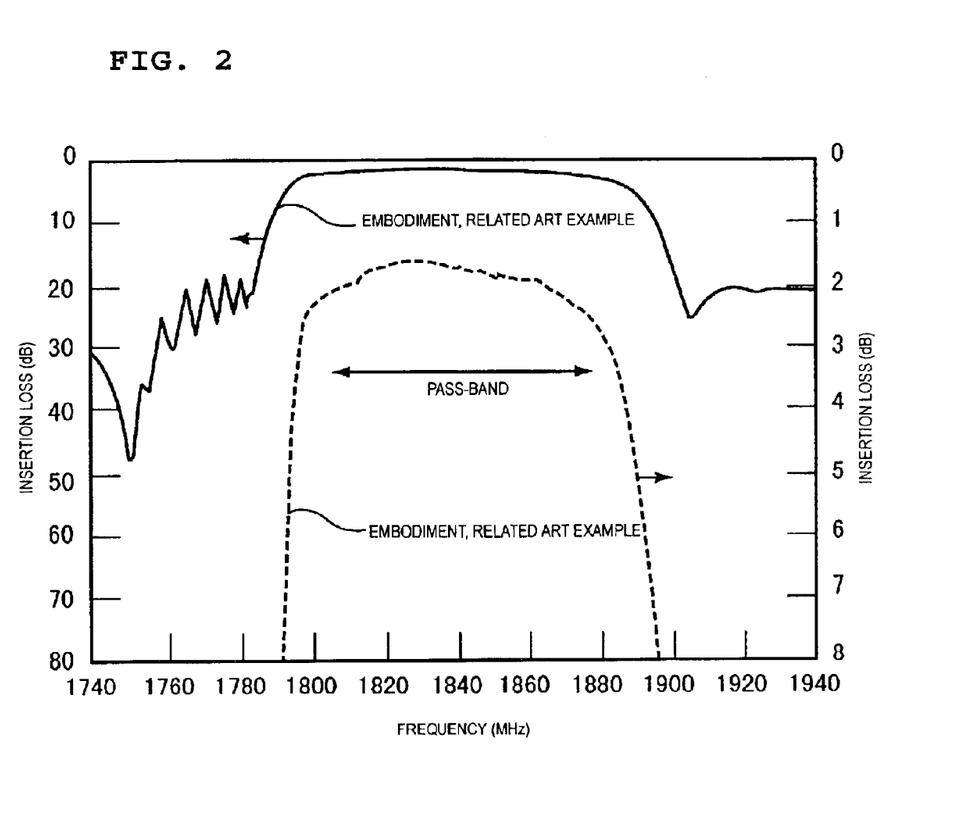
FIG. 2 is a graph showing the transmission characteristics of the surface acoustic wave devices according to a preferred embodiment of the present invention and the related art.
Figure 3:
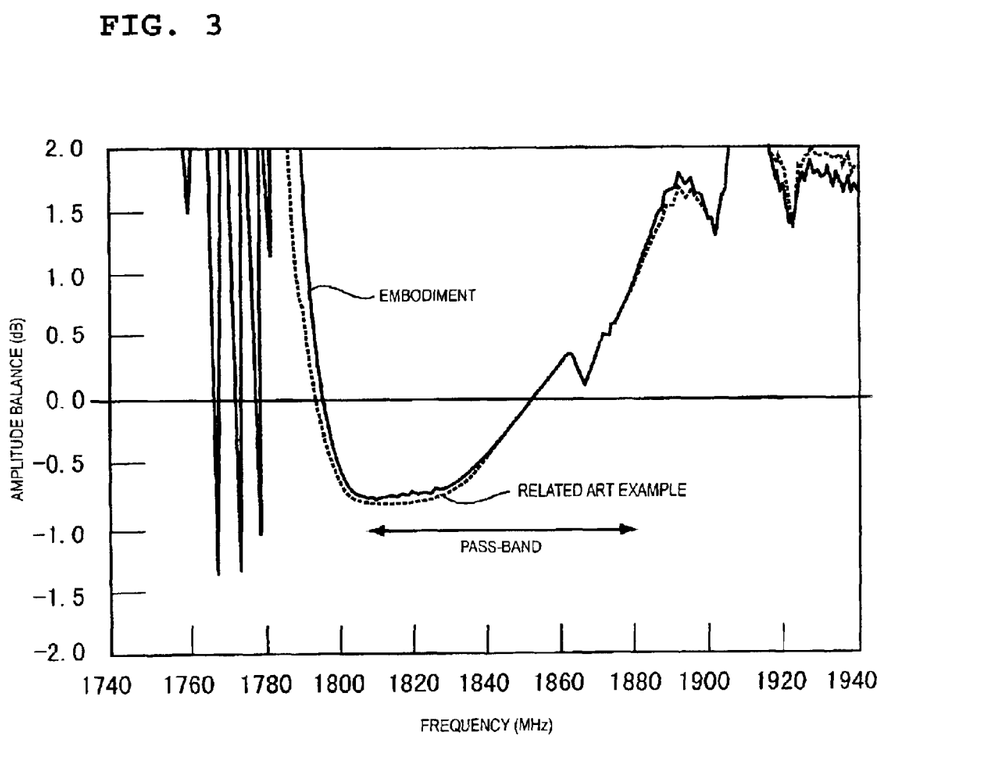
FIG. 3 is a graph showing the amplitude balance characteristics of the surface acoustic wave devices according to a preferred embodiment of the present invention and the related art.
Figure 4:
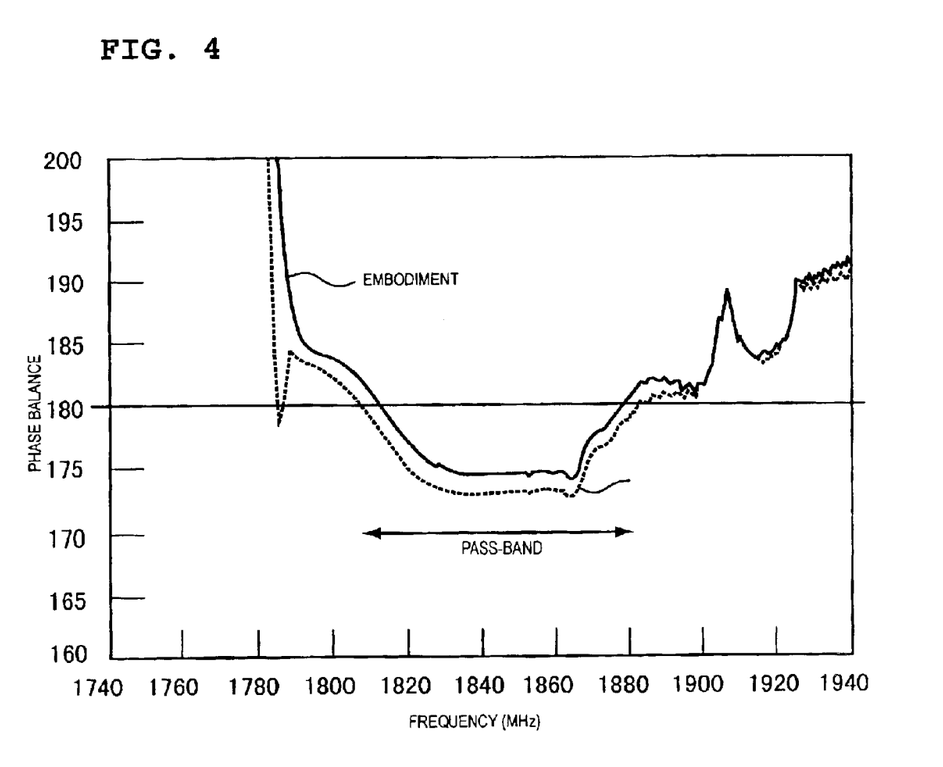
FIG. 4 is a graph showing the phase balance characteristics of the surface acoustic wave devices according to a preferred embodiment of the present invention and the related art.

- the numbers of electrode fingers in the reflectors 108 and 109: 120
- the wavelength λI in IDTs 105 to 107 and 105' to 107': about 2.1422 μm
- the wavelength in the narrow pitch regions of the IDTs: about 1.9295 μm
- the wavelength λR in a reflector: about 2.1770 μm
- the IDT to IDT interval in the SAW filters 101 and 102: about 0.4432λR
- the IDT to reflector interval in the SAW filters 101 and 102: about 0.496λR
- the IDT electrode finger width/pitch in the SAW filters 101 and 102 (duty ratio): about 0.63
- the electrode finger meshing width in the SAW resonators 103 and 104: about 40 μm
- the IDT number in the SAW resonators 103 and 104: 201
- the number of electrode fingers in a reflector of each of the SAW resonator 103 and 104: 30
- the wavelengths in IDT and reflector of the SAW resonators 103 and 104: about 2.1096 μm
- the line length of delay line 116: about 350 μm
- the line length of delay line 117: about 350 μm FIGS. 2 to 4 show the characteristics of the surface acoustic wave device configured as described above. For comparison, FIGS. 2 to 4 also show the characteristics of the related art surface acoustic wave device designed and shown in FIG. 6 which is the same as that of the above-described preferred embodiment of the present invention except that no delay lines 116 and 117 are provided. FIG. 2 shows the frequency—transmission amplitude characteristics, FIG. 3 shows the frequency—amplitude balance characteristics, and FIG. 4 shows the frequency—phase balance characteristics. In FIG. 2, the broken line represents the characteristics plotted based on a magnified scale on the right side of the graph. The broken lines for the related art example and the preferred embodiment of the present invention overlap each other, since the characteristics thereof are substantially coincident with each other. In FIGS. 3 and 4, the characteristics of the preferred embodiment are shown by solid lines, and those of the related art example are illustrated by broken lines.

As seen in FIGS. 2 and 3, the frequency—transmission amplitude characteristics and the frequency—amplitude balance characteristics of the surface acoustic wave devices according to the present preferred embodiment and the related art example have substantially no differences.

On the other hand, as seen in FIG. 4, the phase balance characteristic in the pass-band of the surface acoustic wave device 100 of the present preferred embodiment is considerably improved compared to that of the related art surface acoustic wave device. In particular, the phase balance characteristic of the related art example has the maximum deviation of about 7.2° from 180° near the 1865 MHz. On the other hand, the maximum deviation near the above-described frequency of the phase balance characteristic of the embodiment is considerably reduced, namely, is 5.8°.

In the related art example, the phase balance characteristic is shifted in the negative direction from 180°. For the present preferred embodiment of the present invention, the phase balance characteristic is shifted by about 1.5° in the positive direction from that of the related art characteristic. Thus, the superior phase balance characteristic in the pass-band is achieved. This is due to the fact that the phase of a signal output from the first balanced signal terminal 113 as an output signal terminal is delayed correspondingly to the line lengths of the delay lines 116 and 117.

As described above, for the related art surface acoustic wave device 200 having no delay lines 116 and 117, the phase balance characteristic in a large portion of the pass-band is shifted in the negative direction from 180°. Thus, according to this preferred embodiment, the delay lines 116 and 117 are introduced on the signal line between the unbalanced signal terminal 112 and the balanced signal terminal 113, respectively. Thereby, the phase balance characteristic is shifted in the positive direction.

On the other hand, if a corresponding related art example having no delay lines introduced to cause the phase balance characteristic to be shifted in the positive direction, delay lines may be introduced on the signal line between the balanced signal terminal 112 and the balanced signal terminal 114, so that the phase balance characteristic is shifted in the negative direction. In this case, the balanced signal terminal 114 is the first balanced signal terminal according to preferred embodiments of the present invention.

In other words, according to preferred embodiments of the present invention, the difference between the phases of signals output from the SAW filter 101 and from the SAW filter 102, caused by the difference between the configurations of the SAW filters 101 and 102, is adjusted by making different the line length between the unbalanced signal terminal 112 and the balanced signal terminal 113 from that between the unbalanced signal terminal 112 and the balanced signal terminal 114. Thereby, the phase balance characteristic is greatly improved.

As described above, in the surface acoustic wave device 100 of this preferred embodiment, the delay lines 116 and 117 are arranged on the piezoelectric substrate. The delay lines 116 and 117 can be disposed on a package (not shown) onto which the piezoelectric substrate is mounted. However, when the design of the package is changed, a long time is required for trial production. In addition, great labor and cost are required. Even if the mass production becomes possible, the versatility of the package is reduced, and the cost of the package is increased.

On the other hand, according to this preferred embodiment, the delay lines 116 and 117 are arranged on the piezoelectric substrate. Accordingly, the delay lines can be formed easily with high precision by a photolithography process, for example. Moreover, the design of the delay lines can be easily modified. The package can be formed so as to be suitable for common use. Thus, the versatility of the package is greatly improved.

Also, according to this preferred embodiment, in the surface acoustic wave device having a balanced-to-unbalanced function, the delay line 116 is incorporated on the balanced signal terminal 113 side, and the delay line 117 is incorporated on the common connection point 110 side. In this case, the delay time and the shift amount of the phase balance characteristic are determined by the total line length of the delay lines 116 and 117. Accordingly, by providing both of the delay lines 116 and 117, the phase balance characteristic can be shifted even more. In other words, a delay line having a required length can be divided into two parts. Accordingly, the line length per one delay line can be reduced. The delay lines can be easily arranged in a restricted space on the piezoelectric substrate.

However, according to this preferred embodiment, the delay line 116 is not necessarily provided. Only the delay line 117 may be provided, and thereby, the phase balance characteristic can be considerably improved as described above.

Also, in the case where the surface acoustic wave device 100 is mounted onto a package by a flip-chip bonding process, bumps made of gold are formed on the portions of the piezoelectric substrate on which the signal terminals 112, 113, and 114 are provided. In this case, large occupied areas are required for bump-bonding. Especially, in some cases, a space in which the delay line 116 is to be arranged can not be secured on the side where the balanced signal terminals 113 and 114 are provided. In these cases, according to this preferred embodiment, a space in which the delay line 117 is arranged can be taken on the unbalanced signal terminal 112 side. Thus, the delay line 117 can be easily arranged on the piezoelectric substrate.

According to the above-described preferred embodiment, the delay line 117 is provided as a portion of the signal line between the common connection point 110 and the IDTs 105 and 107. The delay line 117 may be configured in another form. For example, to provide the delay line 117, wires may be incorporated in a portion of the signal line between the unbalanced signal terminal 112 and the common connection point 110 and in a portion of the signal line between the common connection point 110 and the IDTs 105 and 107 in FIG. 1. That is, a wire may be used so as to connect an electrode pad in connection to the unbalanced signal terminal 112 to an electrode pad in connection to the IDTs 105 and 107, whereby the unbalanced signal terminal 110 is connected to the IDTs 105 and 107, and thus, the delay line is provided.

The above other forms of preferred embodiment are explained in detail. For example, instead of making use of the signal line pattern arranged on the piezoelectric substrate to form the delay line 117, wires may be used between the unbalanced signal terminal 112 and the SAW filters 101 and 102. That is, a first wire may be used so as to connect an electrode pad associated with the unbalanced signal terminal 112 to an electrode pad associated with the IDTs 105 and 107, and a second wire can be used to connect an electrode pad associated with the unbalanced signal terminal 112 to an electrode pad associated with the IDTs 105' and 107'. The first wire is longer than the second wire, so as to add a delay line in the path from the unbalanced signal terminal 112 to the SAW filter 101.

In another example of an alternative configuration, although the signal line pattern provided on the piezoelectric substrate is used to constitute the delay line 117, this time the delay line is not formed by creating a bent portion of the signal line, instead it is provided by shifting the position of the common connection point 110 towards the right compared to the position shown in FIG. 1. In other words, in contrast to the situation in FIG. 1 where the common connection point 110 is located midway between the SAW filters 101 and 102, in the present alternative configuration the common connection point 110 is located closer to the SAW filter 102 than to the SAW filter 101. (In other words, the wire connecting the unbalanced signal terminal 112 to the signal line pattern on the piezoelectric substrate, connects to the signal line pattern at a location (110) which is closer to the SAW filter 102 than to the SAW filter 101). The extra distance between the common connection point 110 and the SAW filter 101 defines the delay line.

Figure 5:
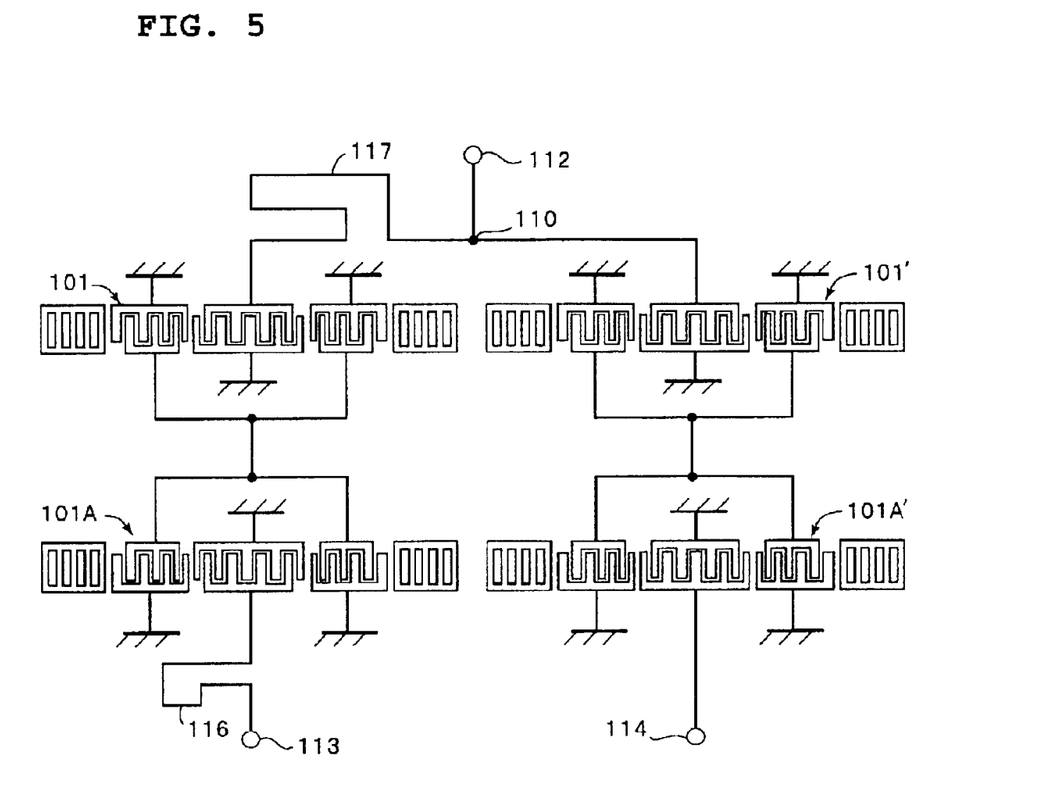
FIG. 5 is a schematic plan view of a modification of the surface acoustic wave device of preferred embodiments of the present invention.

A surface acoustic wave device having a balanced-to-unbalanced function to which this preferred embodiment is applied is not especially restricted, provided that two SAW filters are commonly connected on the unbalanced signal terminal side. That is, the configuration of the surface acoustic wave device may be as shown in FIG. 1, or may include a first SAW filter element including cascade-type resonator SAW filters 101 and 101A which are longitudinally coupled to each other in two steps, and a second SAW filter element including cascade-type resonator SAW filters 101' and 101A' which are longitudinally coupled to each other in two steps, as shown in FIG. 5. Moreover, needless to say, the SAW resonators 103 and 104 are not necessarily provided in the configuration of FIG. 1.

The design parameters such as the electrode finger meshing width set forth for the surface acoustic wave device 102 of the above-described preferred embodiment may be changed, if necessary. In this case, the advantages of the present invention can be also obtained.

As described above, the advantage with which the phase balance characteristic can be improved by introduction of the delay line on the unbalanced signal terminal side in the signal line between the unbalanced signal terminal and the first balanced signal terminal is based on the fact that the phase of a signal is delayed according to the length of the delay line. Accordingly, the shift amount of the phase balance characteristic corresponds to the required length of the delay line, that is, the difference between the line length from the unbalanced signal terminal 112 to the balanced signal terminal 113 and the line length from the unbalanced signal terminal 112 to the balanced signal terminal 114.

Hereinafter, the length of a delay line which is especially effective according to preferred embodiments of the present invention will be described.

The phase balance characteristic of the related art example is shifted by about ±7° from 180° in the pass-band, as seen in the frequency—phase balance characteristic of the related art example shown in FIG. 4. Practically, phase deviations of ±several degrees are present in surface acoustic wave devices having other configurations.

According to preferred embodiments of the present invention, to improve the phase balance characteristic, it is preferred to set the phase shift amount at about 0.5° or more. Thus, the phase balance characteristic can be improved effectively and sufficiently, if the phase shift amount of at least about 0.5° is attained.

As shown in FIG. 4, the phase balance characteristic is not shifted in a constant direction from the phase balance degree of 180° in the pass-band, but toward the positive side or the negative side depending on the frequency. For example, as shown in FIG. 4, the phase balance characteristic is improved almost in the whole frequency range of the pass-band. However, the phase balance characteristic tends to be shifted toward the positive side and deteriorated at about 1800 MHz. If the phase balance characteristic is desired to be further improved according to the configuration of the first preferred embodiment of the present invention, the improvement amount is a maximum of about +1.5°, due to the presence of the above-described frequency region at about 1800 MHz.

As ascertained in the examination by the inventors of preferred embodiments of the present invention, to produce the phase balance characteristic according to preferred embodiments of the present invention, it is most appropriate that the length of the delay line is set in such a manner that the phase shift amount becomes up to about 4°. If the phase shift amount is excessively large, a very long line will be required on the piezoelectric substrate. Also, the resistance is increased, and the occupied area also is increased. Accordingly, to improve the phase balance characteristic, avoid increasing of the resistance, and reduce the size according to preferred embodiments of the present invention, preferably, the phase shift amount is in the range of about 0.5° to about 4°.

The propagation speed of an electrical signal is about $3\times10^8$ m/second. Thus, the length per one wavelength λ of an electrical signal at the center frequency is about $3\times10^8\times10^3/(fc\times10^6)$ (mm/λ)=$3\times10^5/fc$ (mm/λ).

Accordingly, the length of a delay line required for a phase shift of about 1° is about $3\times10^8\times10^3/(fc\times10^6)/360$ (mm/degree)=833/fc (mm/degree).

Therefore, the length L (mm) of the delay line corresponding to the phase shift range of about 0.5° to about 4° is approximately 417/fc<L<3330/fc. That is, preferred embodiments of the present invention are more advantageous when the delay line having a length in the above-described range is provided.

For example, according to the above-described preferred embodiment of the present invention, to provide only the delay line 117 on the unbalanced signal terminal side without the delay line 116 being provided on the balanced signal terminal side, the length of the delay line 117 is preferably set at about 700 μm, and thereby, the phase balance characteristic can be shifted by about 1.6°. Moreover, to provide the delay line 116 also on the balanced signal terminal side as shown in FIG. 1, the lengths of the delay lines 116 and 117 are preferably set to be longer by about 350 μm by bending the signal wirings, respectively. Thus, similarly, the phase balance characteristic can be shifted by about 1.6°.

In the case where the delay lines are ideal microstrip lines, wavelength-shortening effects can be obtained due to the effective dielectric constant ϵe which depends on the shape and size of the microstrip line. Thus, the wavelength of a propagation signal is reduced to be about $1/(\epsilon e)^{1/2}$ times thereof. In the above-described preferred embodiment, the effective dielectric constant ϵe becomes about a half of the permittivity ϵr of the piezoelectric substrate, since the thickness of the piezoelectric substrate is sufficiently large than the strip line width. In the above-described preferred embodiment, an LiTaO3; substrate having a permittivity ϵr of about 43 is preferably used as the piezoelectric substrate. Accordingly, the wavelength of a propagation signal is approximately $1/(21.5)^{1/2}=0.22$ (times). That is, the wavelength is shortened to about 22% thereof. This means that the length of the delay line required to shift the phase balance characteristic is shortened by the compression amount.

However, in the above-described example, the overall length of the delay lines 116 and 117 is preferably about 700 μm, and thereby, the phase balance characteristic is shifted by about 1.6°. This result shows that the above-described wavelength shortening effect does not need to be considered. The possible reason is as follows: the delay lines 116 and 117 have a substantially U-letter shape, as shown in FIG. 1, and also, the ground electrode or signal electrodes are arranged around the delay lines, so that the above-described theoretical expression is not effective.

If the above-described wavelength-shortening effect is obtained due to the delay line arranged as described above, the length of the delay line can be shortened according to the wavelength-shortening effect. However, the inventors of preferred embodiments of the present invention have confirmed that the wavelength-shortening effect exerts substantially no influences when the delay line is provided in a narrow space on the piezoelectric substrate. Accordingly, to improve the phase balance characteristic of the surface acoustic wave device in practice according to preferred embodiments of the present invention, it is especially effective to provide the delay line having a length L that is in range of approximately $417/fc<L<3330/fc$, as described above.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
    a piezoelectric substrate;
    at least one interdigital transducer arranged on the piezoelectric substrate;
    an input terminal and an output terminal, one of the input terminal and the output terminal including an unbalanced signal terminal, the other of the input terminal and the output terminal including first and second balanced signal terminals; and
    a delay line provided on the unbalanced signal terminal side in a path between the unbalanced signal terminal and the first balanced signal terminal.

2. A surface acoustic wave device according to claim 1, wherein the delay line is disposed on the piezoelectric substrate.

3. A surface acoustic wave device according to claim 1, wherein the device is configured so that phases of input-output signals in the line between the unbalanced signal terminal and the first balanced signal terminal and, the phases of the input-output signals in the line between the unbalanced signal terminal and the second balanced signal terminal are different by about 0.5° to about 4° from each other, due to the delay line.

4. A surface acoustic wave device according to claim 1, further comprising a second delay line which is connected to the first balanced signal terminal and is disposed on the piezoelectric substrate.

5. A surface acoustic wave device according to claim 4, wherein the device is configured so that the phases of input-output signals in the line between the unbalanced signal terminal and the first balanced signal terminal and, the phases of the input-output signals in the line between the unbalanced signal terminal and the second balanced signal terminal are different by about 0.5 to about 4° from each other, due to the delay line and the second delay line.

6. A surface acoustic wave device according to claim 1, wherein on the piezoelectric substrate, a length of the signal line between the unbalanced signal terminal and the first balanced signal terminal and a length of the signal line between the unbalanced signal terminal and the second balanced signal terminal are different from each other, and the difference L (mm) between the line lengths satisfies the formula $417/fc<L<3330/fc$ in which fc represents the center frequency (MHz).

7. A surface acoustic wave device comprising:
    a first surface acoustic wave filter element including a piezoelectric substrate, and at least two interdigital transducers arranged along the surface acoustic wave propagation direction on the piezoelectric substrate;
    a second surface acoustic wave filter element including the piezoelectric substrate, and at least two interdigital transducers arranged along the surface acoustic wave propagation direction on the piezoelectric substrate, the second surface acoustic wave filter element having a transmission phase characteristic that is different by about 180° from that of the first surface acoustic wave filter element;
    the first and second surface acoustic wave filter elements each having an input terminal and an output terminal, selected ones of the input terminals and the output terminals of the first and second surface acoustic wave filter elements being commonly connected to each other at a common connection point;
    an unbalanced signal terminal being connected to the common connection point;
    the other terminals of the input terminals and the output terminals of the first and second surface acoustic wave filter elements defining first and second balanced signal terminals, respectively; and
    a delay line provided between the common connection point and the first surface acoustic wave filter element.

8. A surface acoustic wave device according to claim 7, wherein the delay line is disposed on the piezoelectric substrate.

9. A surface acoustic wave device according to claim 7, wherein a length of the signal line between the common connection point and the interdigital transducers of the first surface acoustic wave filter element electrically connected to the common connection point is different from a length of the signal line between the common connection point and the interdigital transducers of the second surface acoustic wave filter element electrically connected to the common connection point.

10. A surface acoustic wave device according to claim 7, wherein the device is configured so that phases of input-output signals in the line between the unbalanced signal terminal and the first balanced signal terminal and, the phases of the input-output signals in the line between the unbalanced signal terminal and the second balanced signal terminal are different by about 0.5° to about 4° from each other.

11. A surface acoustic wave device according to claim 7, further comprising a second delay line which is connected to the first balanced signal terminal and is disposed on one of the first piezoelectric substrate and the second piezoelectric substrate.

12. A surface acoustic wave device according to claim 11, wherein the device is configured so that the phases of input-output signals in the line between the unbalanced signal terminal and the first balanced signal terminal and, the phases of the input-output signals in the line between the unbalanced signal terminal and the second balanced signal terminal are different by about 0.5 to about 4° from each other, due to the delay line and the second delay line.

13. A surface acoustic wave device according to claim 7, a length of the signal line between the unbalanced signal terminal and the first balanced signal terminal and a length of the signal line between the unbalanced signal terminal and the second balanced signal terminal are different from each other, and the difference L (mm) between the line lengths satisfies the formula 417/fc<L<3330/fc in which fc represents the center frequency (MHz).

14. A surface acoustic wave device comprising:
- a first surface acoustic wave filter element including a piezoelectric substrate, and at least two interdigital transducers arranged along the surface acoustic wave propagation direction on the piezoelectric substrate;
- a second surface acoustic wave filter element including the piezoelectric substrate, and at least two interdigital transducers arranged along the surface acoustic wave propagation direction on the piezoelectric substrate, the second surface acoustic wave filter element having a transmission phase characteristic that is different by about 180° from that of the first surface acoustic wave filter element;
- the first and second surface acoustic wave filter elements each having an input terminal and an output terminal, selected ones of the input terminals and the output terminals of the first and second surface acoustic wave filter elements being commonly connected to each other at a common connection point;
- an unbalanced signal terminal being connected to the common connection point; and
- the other terminals of the input terminals and the output terminals of the first and second surface acoustic wave filter elements defining first and second balanced signal terminals, respectively,
- wherein a first length of the signal line between the common connection point and the interdigital transducers of the first surface acoustic wave filter element electrically connected to the common connection point is different from a second length of the signal line between the common connection point and the interdigital transducers of the second surface acoustic wave filter element electrically connected to the common connection point.

15. A surface acoustic wave device according to claim 14, wherein the first length of the signal line between the common connection point and the interdigital transducers of the first surface acoustic wave filter element electrically connected to the common connection point and the second length of the signal line between the common connection point and the interdigital transducers of the second surface acoustic wave filter element electrically connected to the common connection point are different from each other such that the phases of input-output signals are different from each other by a degree of about 0.5° to about 4° in the line between the unbalanced signal terminal and the first balanced signal terminal and in the line between the unbalanced signal terminal and the second balanced signal terminal.

16. A surface acoustic wave device according to claim 14, wherein the device is configured so that phases of input-output signals in the line between the unbalanced signal terminal and the first balanced signal terminal and, the phases of the input-output signals in the line between the unbalanced signal terminal and the second balanced signal terminal are different by about 0.5° to about 4° from each other.

17. A surface acoustic wave device according to claim 14, wherein on the piezoelectric substrate, a length of the signal line between the unbalanced signal terminal and the first balanced signal terminal and a length of the signal line between the unbalanced signal terminal and the second balanced signal terminal are different from each other, and the difference L (mm) between the line lengths satisfies the formula 417/fc<L<3330/fc in which fc represents the center frequency (MHz).

* * * * *